(12) United States Patent
Zhang et al.

(10) Patent No.: US 9,941,400 B2
(45) Date of Patent: Apr. 10, 2018

(54) SEMICONDUCTOR DEVICE AND METHOD OF MANUFACTURING THE SAME

(71) Applicant: Dynax Semiconductor, Inc., Kunshan (CN)

(72) Inventors: Naiqian Zhang, Kunshan (CN); Fengli Pei, Kunshan (CN)

(73) Assignee: DYNAX SEMICONDUCTOR, INC., Kunshan (CN)

( * ) Notice: Subject to any disclaimer, the term of this patent is extended or adjusted under 35 U.S.C. 154(b) by 0 days.

(21) Appl. No.: 14/741,767

(22) Filed: Jun. 17, 2015

(65) Prior Publication Data

US 2015/0311332 A1    Oct. 29, 2015

Related U.S. Application Data

(63) Continuation of application No. PCT/CN2014/090443, filed on Nov. 6, 2014.

(30) Foreign Application Priority Data

Dec. 13, 2013   (CN) .......................... 2013 1 0682785

(51) Int. Cl.
| | |
|---|---|
| *H01L 27/088* | (2006.01) |
| *H01L 29/06* | (2006.01) |
| *H01L 29/778* | (2006.01) |
| *H01L 23/00* | (2006.01) |
| *H01L 23/485* | (2006.01) |
| *H01L 23/488* | (2006.01) |

(Continued)

(52) U.S. Cl.
CPC ........ *H01L 29/7787* (2013.01); *H01L 21/283* (2013.01); *H01L 23/485* (2013.01);

(Continued)

(58) Field of Classification Search
CPC ............. H01L 29/7787; H01L 29/4175; H01L 29/66462; H01L 29/41758; H01L 21/283;
(Continued)

(56) References Cited

U.S. PATENT DOCUMENTS

| | | | | |
|---|---|---|---|---|
| 4,908,680 | A | * | 3/1990 | Matsuoka ........... H01L 29/4175 257/774 |
| 5,919,713 | A | * | 7/1999 | Ishii ...................... B05D 7/146 257/E21.599 |

(Continued)

*Primary Examiner* — Su C Kim
(74) *Attorney, Agent, or Firm* — Flener IP & Business Law; Zareefa B. Flener

(57) ABSTRACT

A semiconductor device includes: a substrate having a rear side on which a grounded electrode is disposed; a semiconductor layer disposed on a front side of the substrate and including an active region and an inactive region; a plurality of source electrodes disposed in the active region; a drain electrode including a plurality of first portions disposed in the active region and a second portion disposed in the inactive region; a gate electrode including a plurality of first portions disposed in the active region and a second portion disposed in the inactive region; and a plurality of source electrode pads having the same number as the plurality of source electrodes and disposed in the inactive region and each being connected to a corresponding source electrode directly. A plurality of through holes electrically connecting the plurality of source electrodes and the grounded electrode respectively are disposed in the plurality of source electrode pads.

16 Claims, 11 Drawing Sheets

(51) Int. Cl.
 *H01L 21/283* (2006.01)
 *H01L 29/417* (2006.01)
 *H01L 29/66* (2006.01)
 *H01L 29/20* (2006.01)
 *H01L 29/423* (2006.01)

(52) U.S. Cl.
 CPC ............ *H01L 23/488* (2013.01); *H01L 24/06* (2013.01); *H01L 29/4175* (2013.01); *H01L 29/41758* (2013.01); *H01L 29/66462* (2013.01); *H01L 29/2003* (2013.01); *H01L 29/42316* (2013.01); *H01L 29/778* (2013.01)

(58) Field of Classification Search
 CPC ..... H01L 23/488; H01L 23/485; H01L 24/06; H01L 29/42316; H01L 29/778; H01L 29/2003
 See application file for complete search history.

(56) References Cited

U.S. PATENT DOCUMENTS

| | | | | |
|---|---|---|---|---|
| 6,166,436 A | * | 12/2000 | Maeda | H01L 21/563 257/723 |
| 6,833,595 B1 | * | 12/2004 | Iwasaki | H01L 27/0207 257/206 |
| 8,872,190 B1 | * | 10/2014 | Young | H01L 23/4821 257/194 |
| 2010/0237437 A1 | * | 9/2010 | Takagi | H01L 23/4824 257/401 |
| 2013/0292689 A1 | * | 11/2013 | Ju | H01L 29/2003 257/76 |
| 2013/0313718 A1 | * | 11/2013 | Varghese | H01L 22/30 257/774 |
| 2014/0034971 A1 | * | 2/2014 | Ishikura | H01L 29/2003 257/77 |

* cited by examiner

SEMICONDUCTOR DEVICE AND METHOD OF MANUFACTURING THE SAME

CROSS-REFERENCE TO RELATED APPLICATIONS

This application is a continuation of international application No. PCT/CN2014/090443 filed on Nov. 6, 2014, titled "Semiconductor Device and Method of Manufacturing the Same", which claims the benefit and priority of Chinese patent application No. 201310682785.0 filed on Dec. 13, 2013, titled "Semiconductor Device and Method of Manufacturing the Same". Both of these applications are incorporated herein in their entirety by reference.

TECHNICAL FIELD

The disclosed embodiments relate to a semiconductor device, and more particularly to a semiconductor device having through holes and a method of manufacturing a semiconductor device.

BACKGROUND

Compared with the first-generation semiconductor of silicon and the second-generation semiconductor of GaAs, the semiconductor material of GaN has many advantages such as large band gap, high electron saturation velocity, high breakdown voltage and ability of withstanding high temperatures, which makes it more suitable for electronic devices having high temperature, high pressure, high frequency and high power. Due to the above-mentioned advantages, GaN has broad application prospects and becomes hot research topic in the field of semiconductor industry.

GaN High Electron Mobility Transistor (HEMT) is formed using two-dimensional electron gas at AlGaN/GaN heterojunction and can be applied to the field of high frequency, high voltage and high power. Depletion mode GaN HEMT devices are generally produced using the characteristic of constant opening of a two-dimensional electron gas channel since the two-dimensional electron gas has high mobility and high saturation velocity, and thus are appropriate for high frequency applications in the field of wireless communications. During the packaging process of GaN devices, a structure having through holes is generally used to increase the gain of the devices and reduce grounded inductance. In this structure, etching is generally performed from the rear side of a substrate which is connected to ground to form through holes which penetrate the substrate and the nitride semiconductor epitaxial layer to a source electrode. And then the through holes are filled with metal so that the source electrode is connected to the grounded rear side of the substrate, and thus the inductance from the source electrode to ground is reduced.

SUMMARY

Embodiments of the present invention are directed to a semiconductor device which is capable of reducing grounded inductance of the semiconductor device.

Embodiments of the present invention are also directed to a method of manufacturing a semiconductor device which is capable of reducing grounded inductance of the semiconductor device.

According to one or more embodiments of the present invention, there is provided a semiconductor device, comprising: a substrate having a rear side on which a grounded electrode is disposed; a semiconductor layer disposed on a front side of the substrate, the semiconductor layer including an enclosed active region and an inactive region which is outside the active region; a plurality of source electrodes disposed in the active region; a drain electrode including a plurality of first portions disposed in the active region and a second portion disposed in the inactive region, the plurality of first portions of the drain electrode each being disposed between adjacent source electrodes; a gate electrode including a plurality of first portions disposed in the active region and a second portion disposed in the inactive region, the plurality of first portions of the gate electrode each being disposed between one of the plurality of source electrodes and one of the plurality of first portions of the drain electrode which are adjacent to each other; and a plurality of source electrode pads having the same number as the plurality of source electrodes, the plurality of source electrode pads being disposed in the inactive region and each being connected to a corresponding source electrode directly, wherein a plurality of through holes electrically connecting the plurality of source electrodes and the grounded electrode respectively are disposed in the plurality of source electrode pads.

There may be one or more than one through hole in each of the plurality of source electrode pads. The plurality of through holes may have cross-sections of a circular shape, an elliptical shape, a square shape or an irregular shape. The plurality of through holes may have different shapes. The plurality of source electrode pads may have cross-sections of a circular shape, an elliptical shape, a square shape or an irregular shape. The plurality of source electrode pads may have different shapes. The plurality of source electrode pads may be disposed at different sides of the active region.

At least one of the plurality of source electrode pads may have a plurality of sub-pads. There may be one through hole in each of the plurality of sub-pads.

The plurality of source electrodes and the plurality of first portions of the drain electrode may be ohmic contact electrodes, the second portion of the drain electrode may be an interconnection metal of the plurality of first portions of the drain electrode. The ohmic contact electrodes may have the same size. The gaps between adjacent ohmic contact electrodes may be the same. The plurality of source electrode pads may have a symmetric arrangement with respect to a central line of the active region.

The semiconductor layer may comprise at least one material selected from a group constituting of gallium nitride, aluminum gallium nitride, indium gallium nitride, indium aluminum gallium nitride, gallium arsenide, indium phosphide and combinations thereof.

According to one or more embodiments of the present invention, there is provided a method of manufacturing a semiconductor device, comprising: preparing a substrate and forming a grounded electrode on a rear side of the substrate; depositing a semiconductor layer on a front side of the substrate, the semiconductor layer including an enclosed active region and an inactive region which is outside the active region; forming a plurality of source electrodes in the active region and a drain electrode including a plurality of first portions disposed in the active region and a second portion disposed in the inactive region, the plurality of first portions of the drain electrode each being disposed between adjacent source electrodes; forming a gate electrode including a plurality of first portions disposed in the active region and a second portion disposed in the inactive region, the plurality of first portions of the gate electrode each being disposed between one of plurality of the source electrodes and one of the plurality of first portions of the drain electrode which are adjacent to each other; forming a plurality of source electrode pads having the same number as the plurality of source electrodes, the plurality of source electrode pads being disposed in the inactive region and each being connected to a corresponding source electrode directly; and forming a plurality of through holes electrically connecting the plurality of source electrodes and the grounded electrode respectively in the plurality of source electrode pads.

The plurality of source electrodes and the plurality of first portions of the drain electrode may be ohmic contact electrodes, the second portion of the drain electrode may be an interconnection metal of the plurality of first portions of the drain electrode. The ohmic contact electrodes may have the same size. The gaps between adjacent ohmic contact electrodes may be the same. The plurality of source electrode pads may have a symmetric arrangement with respect to a central line of the active region.

BRIEF DESCRIPTION OF DRAWINGS

These and other aspects will become apparent and more readily appreciated from the following description of the embodiments, taken in conjunction with the accompanying drawings in which.

DETAILED DESCRIPTION

Figure 1A:
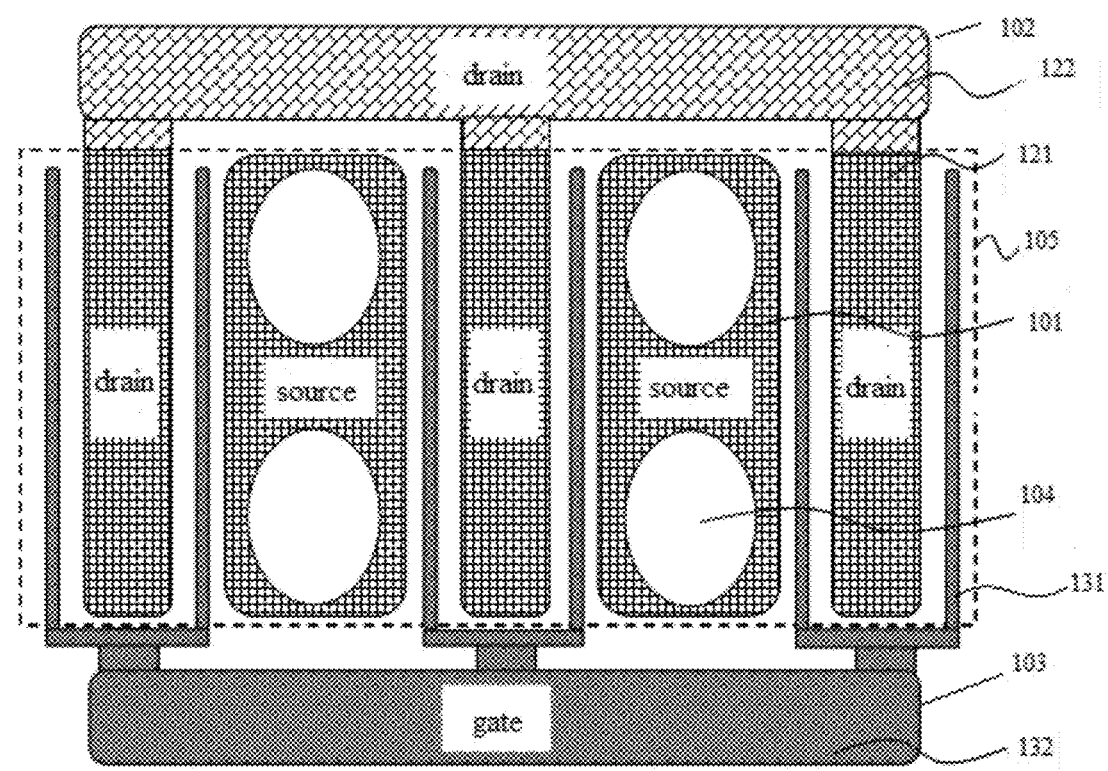
FIG. 1(a) is a schematic view illustrating positions of through holes in a GaN device according to prior art.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

In addition, when an element is referred to as being "on" another element, it can be directly on the other element or be indirectly on the other element with one or more intervening elements interposed therebetween. Also, when an element is referred to as being "connected to" another element, it can be directly connected to the other element or be indirectly connected to the other element with one or more intervening elements interposed therebetween. The use of "may" means "in one or more embodiments".

FIG. 1(a) is a schematic view illustrating positions of through holes in a GaN device according to prior art. As shown in FIG. 1(a), the GaN device includes a plurality of source electrodes 101, a drain electrode 102 and a gate electrode 103. The plurality of source electrodes 101, a first portion 121 of the drain electrode 102 and a first portion 131 of the gate electrode 103 are disposed in an active region 105. A second portion 122 of the drain electrode 102 and a second portion 132 of the gate electrode 103 are disposed in an inactive region which is outside the active region 105. The plurality of source electrodes 101 and the first portion 121 of the drain electrode 102 are ohmic contact electrodes, while the second portion 122 of the drain electrode 102 is metal interconnection of the first portion 121 of the drain electrode 102. The gate electrode 103 is arranged in an interdigital shape, that is, the first portion 131 of the gate electrode 103 includes a plurality of branches which are respectively arranged between a corresponding source electrode 101 and a corresponding first portion 121 of the drain electrodes 102.

In each of the source electrodes 101, there are provided a plurality of through holes 104 which penetrate the source electrodes 101, semiconductor layers (not shown) and a substrate (not shown) to a rear side of the substrate. The through holes 104 connect the source electrodes 101 to the grounded rear side of the substrate, thus the inductance from the source electrodes to ground is reduced.

However, since the through holes 104 are disposed in the source electrodes 101 which are located inside the active region 105, the sizes of the through holes 104 are limited. Small through holes will lead to high grounded inductance and complicated manufacturing process.

In addition, since ohmic contact electrodes are not suitable to act as etching barrier layer, etching source electrodes which are ohmic contact electrodes will damage contact performance of source electrodes and barrier effect of the etching.

Furthermore, under the condition that the total area of the active region 105 is determined, the area of the source electrodes 101 will be increased and the area of the first portion 121 of the drain electrode 102 will be reduced if bigger through holes are required. That is, the area of each of the source electrodes 101 is greater than that of corresponding first portion 121 of the drain electrodes 102. In this case, heat dissipation will be affected since the distribution of ohmic contact electrodes is not uniform.

Figure 1B:
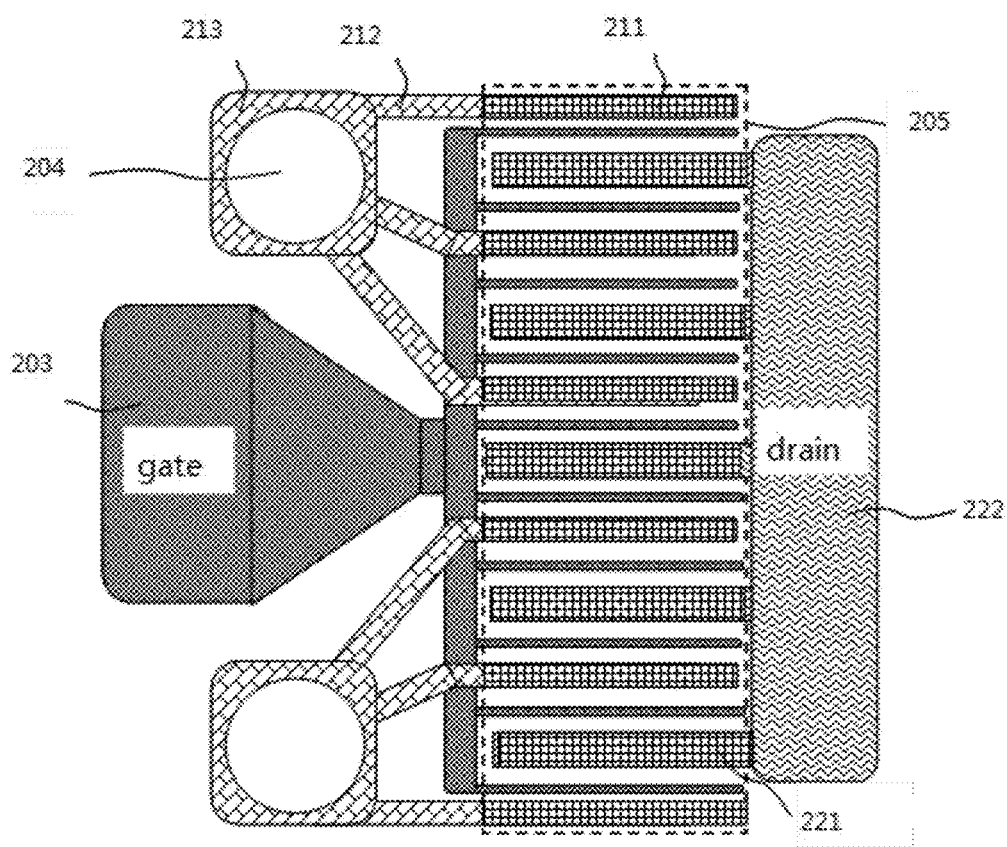
FIG. 1(b) is a schematic view illustrating positions of through holes in a GaN device according to another prior art.

FIG. 1(b) is a schematic view illustrating positions of through holes in a GaN device according to another prior art. As shown in FIG. 1(b), a plurality of source electrodes 211 and a first part of a drain electrode 221 which are located inside an active region 205 are ohmic contact electrodes, a second part of the drain electrode 221 which is located outside the active region 205 is a metal interconnection of the first part of the drain electrode 221 which is ohmic contact electrode. A gate electrode 203 is arranged in an interdigital shape between the source electrodes 211 and the drain electrode 221. The source electrode interconnections 212 and the source electrode pads 213 which are located outside the active region 205 are metal interconnections of the source electrodes 211. Several source electrodes 211 are connected to a same source electrode pad 213 via corresponding source electrode interconnections 212. The source electrode pads 213 are arranged at both sides of the gate electrode 203 symmetrically. A through hole 204 is disposed in each of the source electrode pad 213.

Compared with the configuration in FIG. 1(a), since the through holes 204 are disposed outside the active region 205, the sizes of through holes 204 are not limited, the selection of etching barrier layers is flexible, and the heat dissipation is not affected. However, the configuration in FIG. 1(b) has the disadvantages as follows.

Since the through holes 204 are disposed in the source electrode pads 213 which are connected to the source electrodes 211 via the source electrode interconnections 212, the distance between the source electrodes 211 and the ground is increased, which adversely increases the grounded inductance of the source electrodes 211.

In addition, the source interconnection 212 must cross the gate electrode 203 and thus air bridges must be used. The presence of air bridges makes the device more complicated, thereby increasing the difficulty of the process. During the device packaging process, the air bridges are very easy to be collapsed, reducing the reliability of the device. Also, capacitance is introduced between the source electrodes 211 and the gate electrode 205 due to the air bridges, reducing the high-frequency performance of the device.

Furthermore, the source electrode interconnections 212 have different lengths, thus the source electrodes 211 have different grounded inductances, which affects properties, such as gain, of the device.

In view of this, there is a demand to propose a semiconductor device which is capable of reducing grounded inductance of the device.

Hereinafter, semiconductor devices according to embodiments of the present invention will be described with reference to the attached figures.

Figure 2:
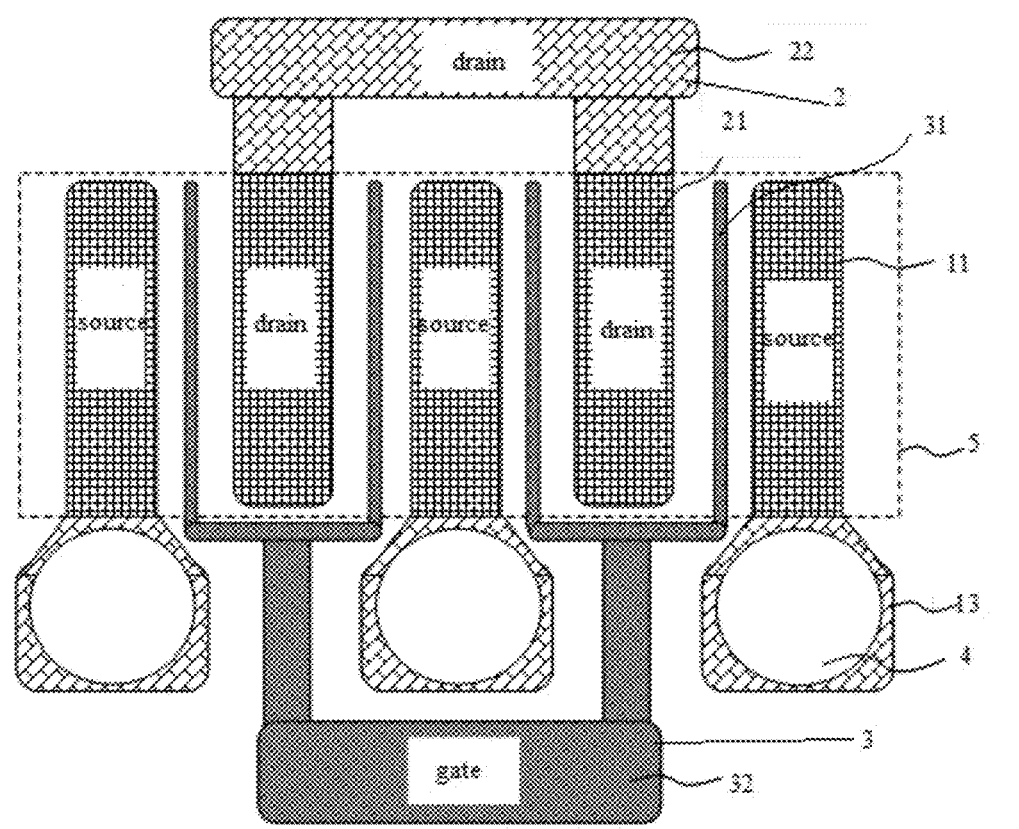
FIG. 2 is a schematic top view of a semiconductor device according to a first embodiment of the present invention.

FIG. 2 is a schematic top view of a semiconductor device according to a first embodiment of the present invention.

As shown in FIG. 2, a semiconductor device according to an embodiment of the present invention includes a substrate (not shown). A grounded electrode (not shown) is disposed on a rear side of the substrate. A semiconductor layer including an active region 5 which is enclosed and an inactive region which is outside the active region 5 is disposed on a front side of the substrate.

The semiconductor device also includes a plurality of source electrodes 11 disposed in the active region 5, a drain electrode 2 including a plurality of first portions 21 disposed in the active region 5 and a second portion 22 disposed in the inactive region, and a gate electrode 3 including a plurality of first portions 31 disposed in the active region and a second portion 32 disposed in the inactive region. Each of the plurality of first portions 21 of the drain electrode 2 is disposed between adjacent source electrodes 11, and each of the plurality of first portions 31 of the gate electrode 3 is disposed between one of the plurality of source electrodes 11 and one of the plurality of first portions 21 of the drain electrode 2 which are adjacent to each other.

A plurality of source electrode pads 13 are disposed in the inactive region. In an embodiment, the number of the source electrode pads 13 is the same as that of the source electrodes 11, for example, there is a one-to-one correspondence between the source electrodes 11 and the source electrode pads 13. Each source electrode pad 13 is connected to a corresponding source electrode 11 directly. That is, there is no intervening elements between them.

A plurality of through holes 4 are disposed in the plurality of source electrode pads 13. The through holes 4 penetrate the semiconductor layer and the substrate, so as to electrically connect the plurality of source electrodes 11 and the grounded electrode disposed on the rear side of the substrate.

In addition, the source electrodes 11 and the first portions 21 of the drain electrode 2 may be ohmic contact electrodes, and the second portion 22 of the drain electrode 2 may be an interconnection metal of the first portions 21 of the drain electrode 2.

Furthermore, the ohmic contact electrodes may have the same size, and the gaps between adjacent ohmic contact electrodes may be the same.

The active region 5 may have a substantial rectangular shape, and the source electrode pads 13 may have a symmetric arrangement with respect to a central line in the longitude direction of the active region 5.

The semiconductor layer may be formed of gallium nitride (GaN), but the present invention is not limited thereto. Instead, the semiconductor layer may be formed of any material selected from a group constituting of gallium nitride, aluminum gallium nitride, indium gallium nitride, indium aluminum gallium nitride, gallium arsenide, indium phosphide and combinations thereof.

According to this embodiment, the through holes 4 are disposed in the source electrode pads 13 in the inactive region, instead of being disposed in the source electrodes 11 in the active region 5, thus the sizes of the through holes 4 are not limited. That is, the though holes 4 according to this embodiment can be formed bigger than those in the prior art as shown in FIG. 1(a). Thus the grounded inductance of the device can be reduced and the manufacturing process can be simplified.

Also, the interconnection metal, rather than the ohmic metal, acts as etching barrier layer. Since the interconnection metal is located outside the active region 5 and has a wide selection of material, the contact performance of source electrodes and barrier effect of the etching will not be damaged.

In addition, since the through holes 4 are disposed in the source electrode pads 13 in the inactive region, instead of being disposed in the source electrodes 11 in the active region 5, thus the though holes 4 according to this embodiment can be formed bigger than those in the prior art as shown in FIG. 1(a), without the requirement to increase the area of the source electrodes 11. That is, the source electrodes 11 may be formed smaller than those in the prior art as shown in FIG. 1(a), for example, the area of each source electrode 11 may be the same as that of each first portion 21 of the drain electrode 2. In this case, the heat dissipation will be improved.

Compared with the configuration in FIG. 1(b), the source electrodes 11 located inside the active region 5 are connected to corresponding source electrode pads 13 directly, without the use of source electrode interconnections, thereby providing the advantages as follows.

The source electrodes 11 located inside the active region 5 are connected to corresponding source electrode pads 13 directly, thus the distance between the source electrodes 11 and the ground is decreased, thereby decreasing the grounded inductances.

In addition, since there are no source electrode interconnections, air bridges crossing the second portion 32 of the gate electrode 3 are not required, which reducing the difficulty of process and improves the reliability and high frequency property of the device.

Furthermore, since there are no source electrode interconnections, instead, the source electrodes 11 are connected to corresponding source electrode pads 13 directly, the problem of different grounded inductances caused by different lengths of source electrode interconnections is avoided, thereby improving the properties, such as gain, of the device.

Figure 3:
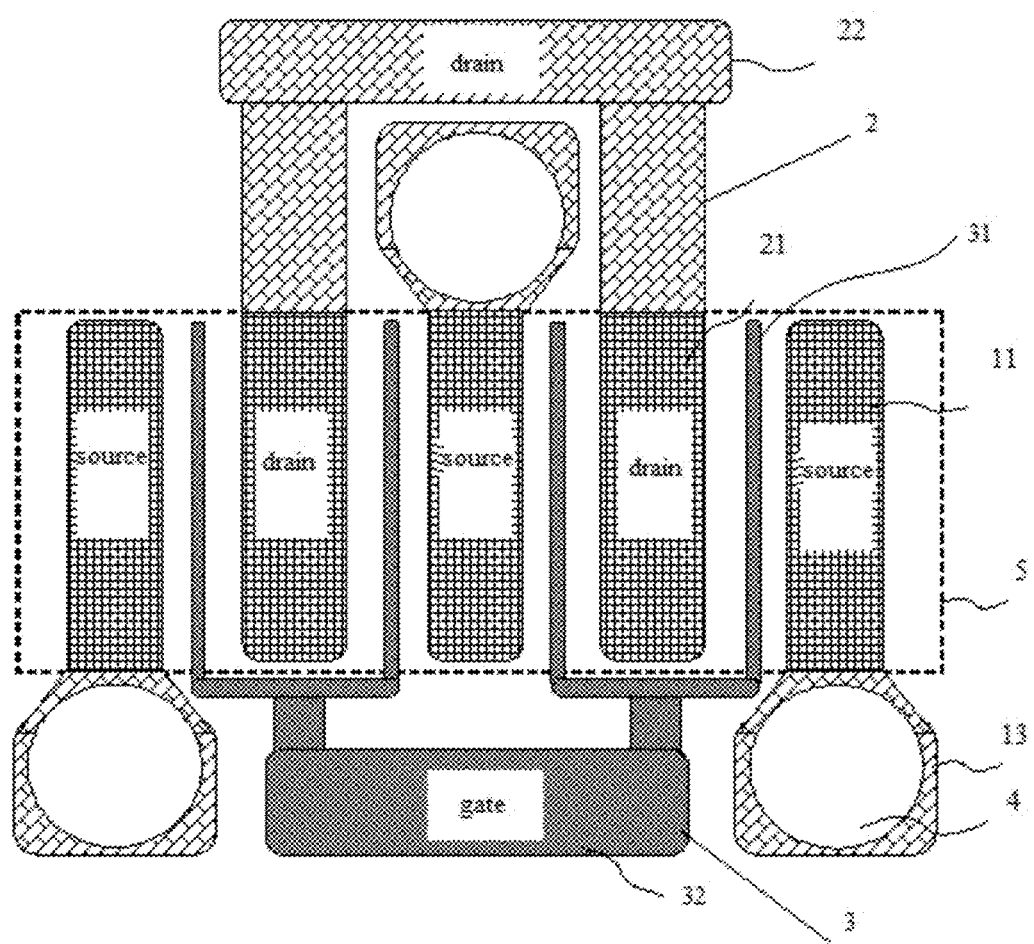
FIG. 3 is a schematic top view of a semiconductor device according to a second embodiment of the present invention.

FIG. 3 is a schematic top view of a semiconductor device according to a second embodiment of the present invention.

As shown in FIG. 3, the source electrode pads 13 are disposed at different sides of the active region 5. For example, as shown in FIG. 3, the middle source electrode pad 13 is disposed at the upper side of the active region 5, while the other two source electrode pads 13 are disposed at the bottom side of the active region 5. Thus, according to this embodiment, the arrangement of the source electrode pads 13 may be more flexible.

Although the source electrode pads 13 are disposed at different sides of the active region 5, it is preferable that source electrode pads 13 still have a symmetric arrangement with respect to the central line of the active region 5.

Except for the above-mentioned structure, the semiconductor device according to this embodiment of the present invention is substantially the same as that according to the first embodiment of the present invention, repeated description will be omitted in order to avoid redundancy.

Figure 4:
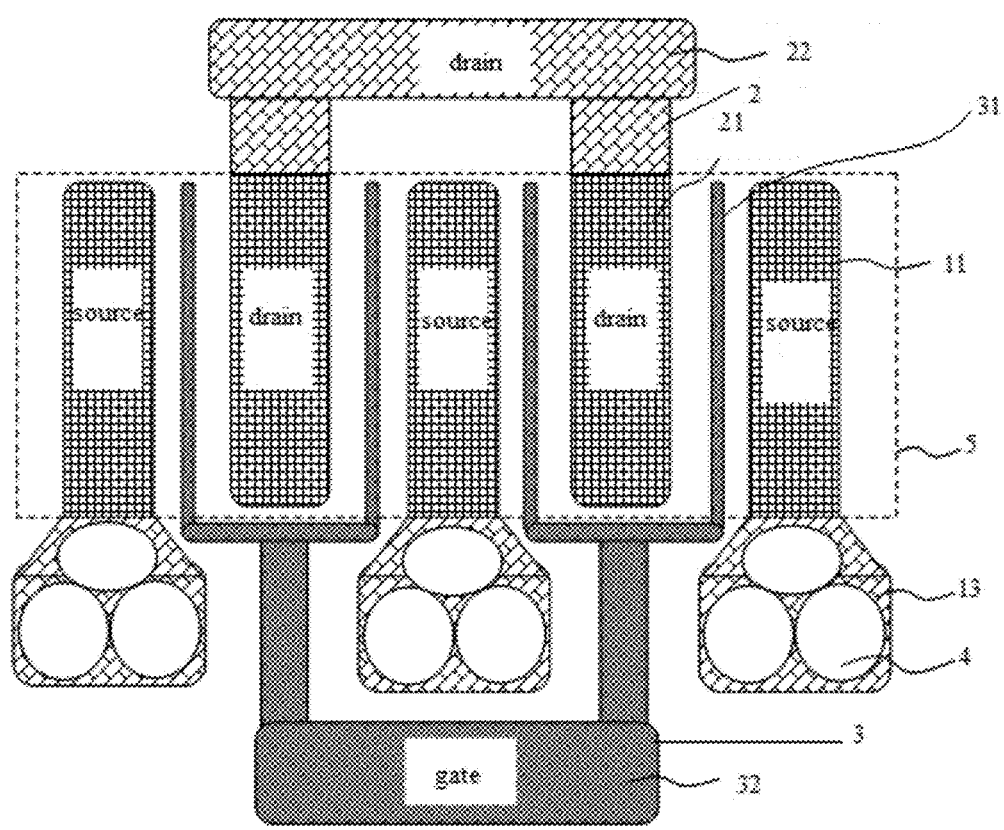
FIG. 4 is a schematic top view of a semiconductor device according to a third embodiment of the present invention.

FIG. 4 is a schematic top view of a semiconductor device according to a third embodiment of the present invention.

As shown in FIG. 4, there are more than one, e.g. three, through holes 4 in each of the source electrode pad 13. The through holes 4 may have the same shape, or alternatively have different shapes. With this structure, the total cross-sectional area of the through holes can be increased and thus the grounded inductance of the device can be further reduced.

Except for the above-mentioned structure, the semiconductor device according to this embodiment of the present invention is substantially the same as that according to the first embodiment of the present invention, repeated description will be omitted in order to avoid redundancy.

Figure 5:
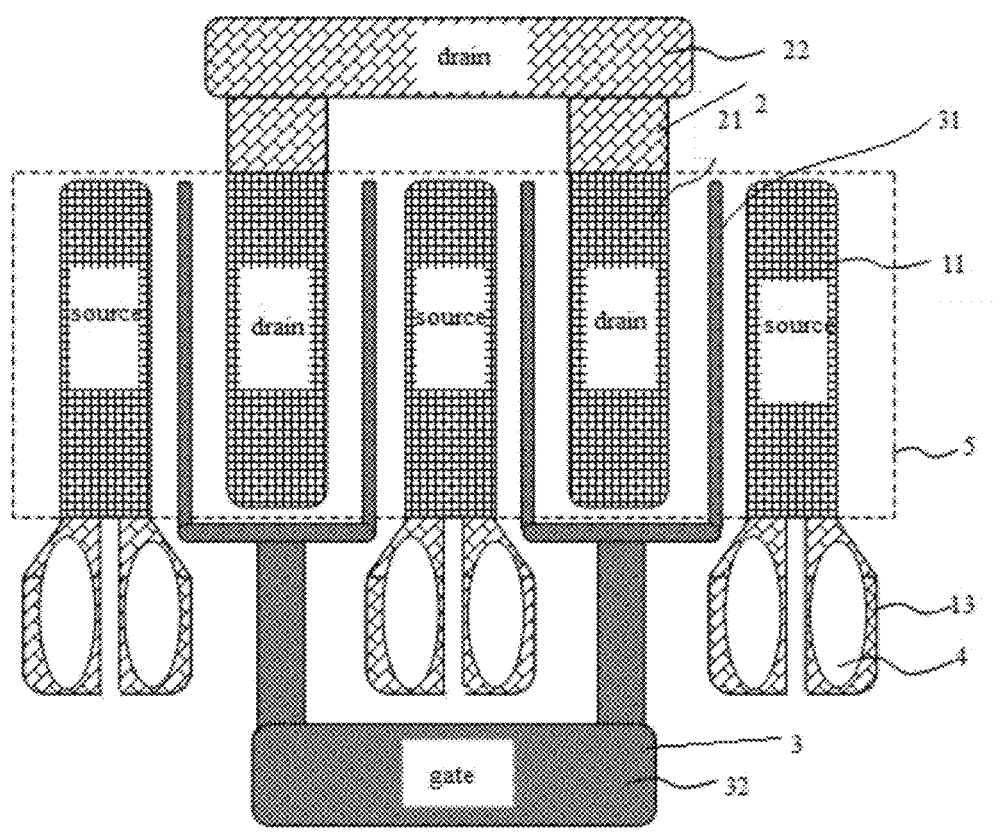
FIG. 5 is a schematic top view of a semiconductor device according to a fourth embodiment of the present invention.

FIG. 5 is a schematic top view of a semiconductor device according to a fourth embodiment of the present invention.

As shown in FIG. 5, each of the source electrode pads 13 includes a plurality of sub-pads, for example two sub-pads as shown. At least one through hole 4 may be formed in each of the sub-pads. With this structure, the utilization of the inactive region can be maximized, and the entire size of the semiconductor device can be reduced.

Except for the above-mentioned structure, the semiconductor device according to this embodiment of the present invention is substantially the same as that according to the first embodiment of the present invention, repeated description will be omitted in order to avoid redundancy.

Figure 6:
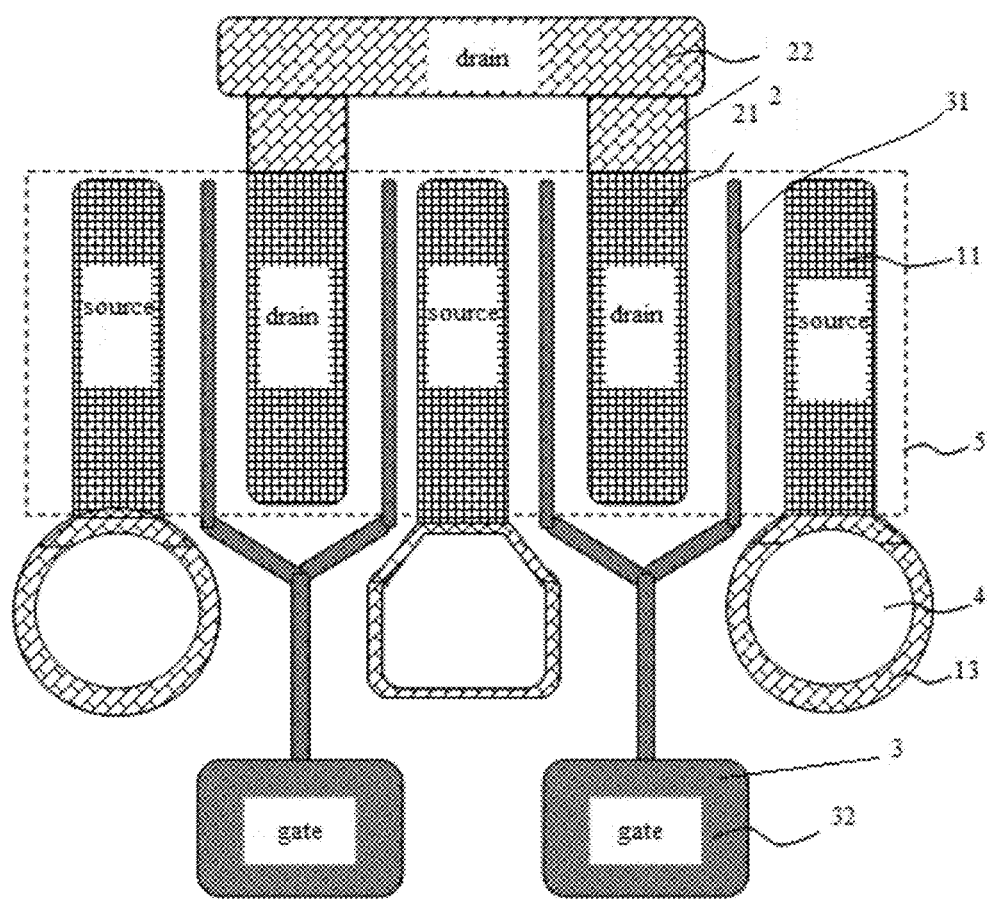
FIG. 6 is a schematic top view of a semiconductor device according to a fifth embodiment of the present invention.

FIG. 6 is a schematic top view of a semiconductor device according to a fifth embodiment of the present invention.

As shown in FIG. 6, the source electrode pads 13 have different shapes, and the through holes 4 also have different shapes. For example, the middle source electrode pad 13 and the through hole 4 formed therein have cross sections of an irregular shape, while the other two source electrode pads 13 and the through holes 4 formed therein have cross sections of a circular shape. Like the fourth embodiment, with this structure, the utilization of the inactive region can be maximized, and the entire size of the semiconductor device can be reduced.

Although the source electrode pads 13 and the through holes 4 may have different shapes, it is preferable that source electrode pads 13 still have a symmetric arrangement with respect to the central line of the active region 5.

Except for the above-mentioned structure, the semiconductor device according to this embodiment of the present invention is substantially the same as that according to the first embodiment of the present invention, repeated description will be omitted in order to avoid redundancy.

Figure 7:
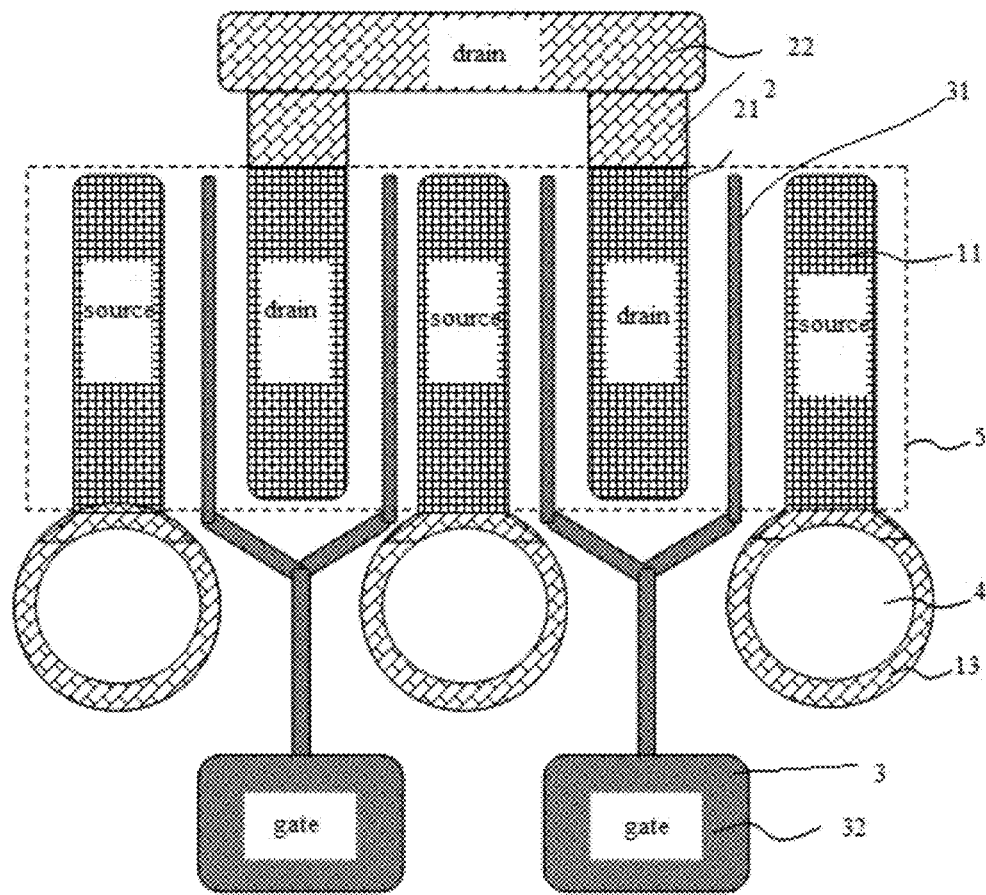
FIG. 7 is a schematic top view of a semiconductor device according to a sixth embodiment of the present invention.
Figure 8:
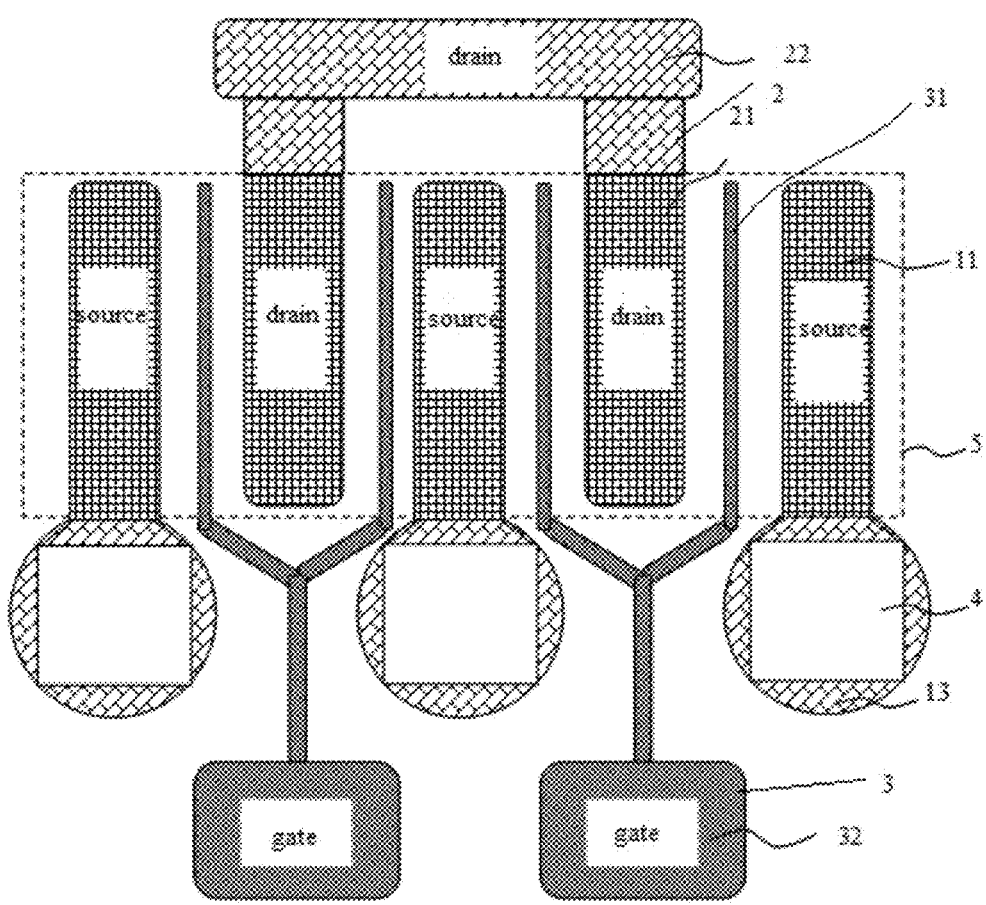
FIG. 8 is a schematic top view of a semiconductor device according to a seventh embodiment of the present invention.
Figure 9:
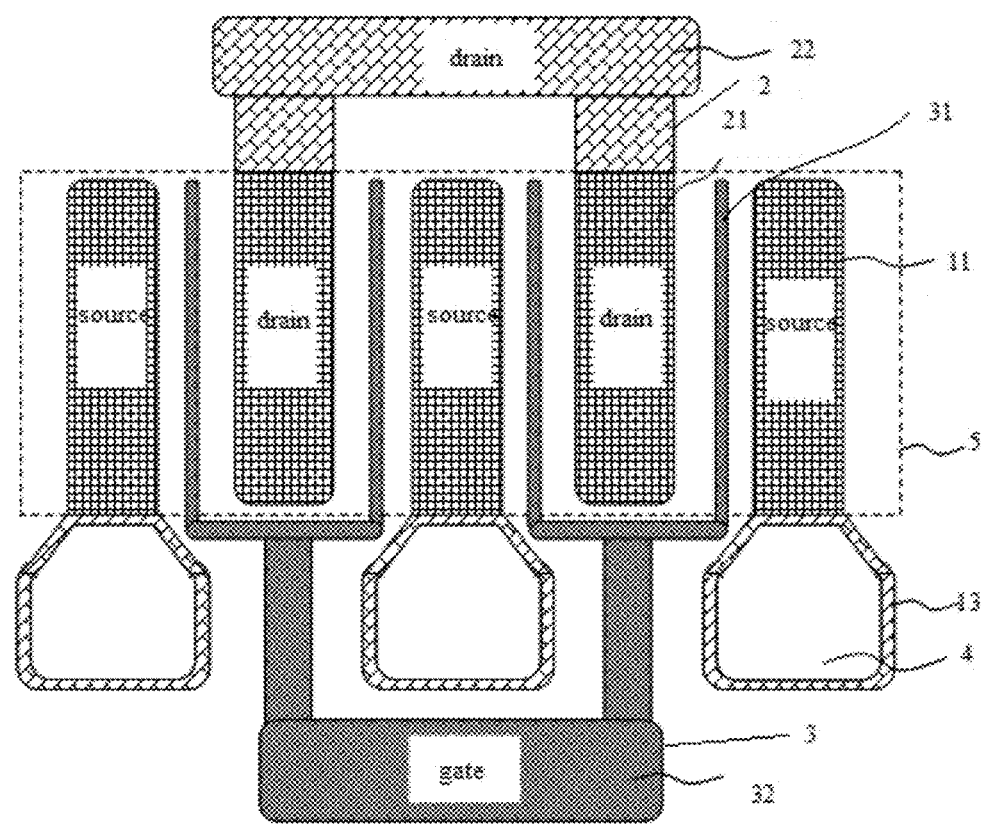
FIG. 9 is a schematic top view of a semiconductor device according to an eighth embodiment of the present invention.

FIGS. 7-9 are schematic top views of semiconductor devices according to a sixth to an eighth embodiment of the present invention.

As shown in FIGS. 7-9, the through holes 4 may have cross-sections of a circular shape, an elliptical shape, a square shape or an irregular shape, and different through holes 4 may have different shapes. Similarly, the source electrode pads 13 may have cross-sections of a circular shape, an elliptical shape, a square shape or an irregular shape, and different source electrode pads 13 may have different shapes.

In addition, one of the source electrodes 13 and corresponding one or more than one through hole 4 formed therein may have the same or different shapes.

A method of manufacturing a semiconductor device will be described now with reference to FIG. 10.

Figure 10:
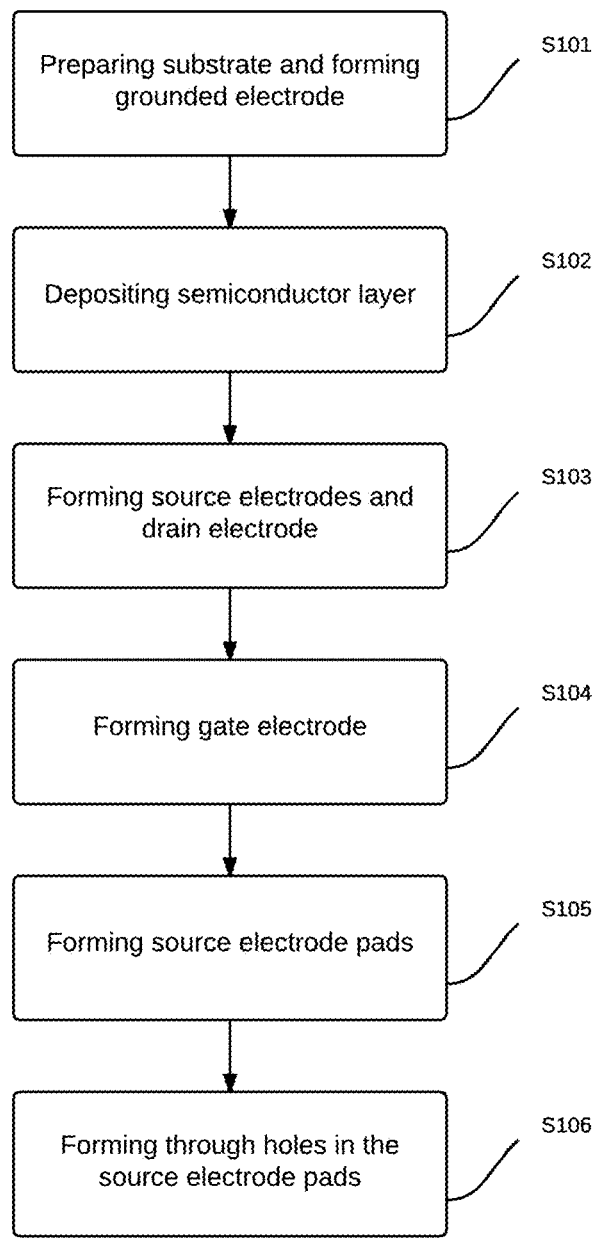
FIG. 10 is a flowchart illustrating a method of manufacturing the semiconductor device according to an embodiment of the present invention.

FIG. 10 is a flowchart illustrating a method of manufacturing the semiconductor device according to an embodiment of the present invention.

As shown in FIG. 10, firstly, at step S101, a substrate is prepared and a grounded electrode is formed on a rear side of the substrate.

Next, at step S102, a semiconductor layer is deposited on a front side of the substrate. The semiconductor layer includes an enclosed active region and an inactive region which is outside the active region.

At step S103, a plurality of source electrodes are formed in the active region, and a drain electrode including a plurality of first portions disposed in the active region and a second portion disposed in the inactive region is formed. The plurality of first portions of the drain electrode each is disposed between adjacent source electrodes.

At step S104, a gate electrode including a plurality of first portions disposed in the active region and a second portion disposed in the inactive region is formed. The plurality of first portions of the gate electrode each is disposed between one of plurality of the source electrodes and one of the plurality of first portions of the drain electrode which are adjacent to each other.

At step S105, a plurality of source electrode pads having the same number as the plurality of source electrodes are formed. The plurality of source electrode pads are disposed in the inactive region and each is connected to a corresponding source electrode directly.

Lastly, at step S106, a plurality of through holes electrically connecting the plurality of source electrodes and the grounded electrode respectively are formed in the plurality of source electrode pads.

In addition, the source electrodes and the first portions of the drain electrode may be ohmic contact electrodes, and the second portion of the drain electrode may be an interconnection metal of the first portions of the drain electrode.

Furthermore, the ohmic contact electrodes may have the same size, and the gaps between adjacent ohmic contact electrodes may be the same.

The active region may have a substantial rectangular shape, and the source electrode pads may have a symmetric arrangement with respect to a central line in the longitude direction of the active region.

It should be understood that the embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims and their equivalents.

What is claimed is:

1. A semiconductor device, comprising:
   a substrate having a rear side on which a grounded electrode is disposed;
   a semiconductor layer disposed on a front side of the substrate, the semiconductor layer including an enclosed active region and an inactive region which is outside the active region;
   a plurality of source electrodes disposed in the active region;
   a drain electrode including a plurality of first portions disposed in the active region and a second portion disposed in the inactive region, the plurality of first portions of the drain electrode each being disposed between adjacent source electrodes;
   a gate electrode including a plurality of first portions disposed in the active region and a second portion disposed in the inactive region, the plurality of first portions of the gate electrode each being disposed between one of the plurality of source electrodes and one of the plurality of first portions of the drain electrode which are adjacent to each other; and
   a plurality of source electrode pads having one-to-one correspondence relationship with the plurality of source electrodes, each of the plurality of source electrode pads being disposed in the inactive region and each being connected to a corresponding source electrode directly,
   wherein a plurality of through holes electrically connecting the plurality of source electrodes and the grounded electrode respectively are disposed in the plurality of source electrode pads,
   wherein the gate electrode does not cross or overlap any of the plurality of source electrodes, and
   wherein the plurality of source electrodes and the plurality of first portions of the drain electrode are ohmic contact electrodes, the second portion of the drain electrode is an interconnection metal of the plurality of first portions of the drain electrode, and the ohmic contact electrodes have the same size.

2. The semiconductor device of claim 1, wherein there is one through hole in each of the plurality of source electrode pads.

3. The semiconductor device of claim 1, wherein there is more than one through hole in each of plurality of the source electrode pads.

4. The semiconductor device of claim 1, wherein the plurality of through holes have cross-sections of a circular shape, an elliptical shape, a square shape or an irregular shape.

5. The semiconductor device of claim 1, wherein the plurality of through holes have different shapes.

6. The semiconductor device of claim 1, wherein the plurality of source electrode pads have cross-sections of a circular shape, an elliptical shape, a square shape or an irregular shape.

7. The semiconductor device of claim 1, wherein the plurality of source electrode pads have different shapes.

8. The semiconductor device of claim 1, wherein the plurality of source electrode pads are disposed at different sides of the active region.

9. The semiconductor device of claim 1, wherein at least one of the plurality of source electrode pads has a plurality of sub-pads.

10. The semiconductor device of claim 9, wherein there is one through hole in each of the plurality of sub-pads.

11. The semiconductor device of claim 1, wherein the gaps between adjacent ohmic contact electrodes are the same.

12. The semiconductor device of claim 1, wherein the plurality of source electrode pads have a symmetric arrangement with respect to a central line of the active region.

13. The semiconductor device of claim 1, wherein the semiconductor layer comprises at least one material selected from a group constituting of gallium nitride, aluminum gallium nitride, indium gallium nitride, indium aluminum gallium nitride, gallium arsenide, indium phosphide and combinations thereof.

14. A method of manufacturing a semiconductor device, comprising:
   preparing a substrate and forming a grounded electrode on a rear side of the substrate;
   depositing a semiconductor layer on a front side of the substrate, the semiconductor layer including an enclosed active region and an inactive region which is outside the active region;
   forming a plurality of source electrodes in the active region and a drain electrode including a plurality of first portions disposed in the active region and a second portion disposed in the inactive region, the plurality of first portions of the drain electrode each being disposed between adjacent source electrodes;
   forming a gate electrode including a plurality of first portions disposed in the active region and a second portion disposed in the inactive region, the plurality of first portions of the gate electrode each being disposed between one of plurality of the source electrodes and one of the plurality of first portions of the drain electrode which are adjacent to each other;
   forming a plurality of source electrode pads having one-to-one correspondence relationship with the plurality of source electrodes, each of the plurality of source electrode pads being disposed in the inactive region and each being connected to a corresponding source electrode directly; and
   forming a plurality of through holes electrically connecting the plurality of source electrodes and the grounded electrode respectively in the plurality of source electrode pads,
   wherein the gate electrode does not cross or overlap any of the plurality of source electrodes, and
   wherein the plurality of source electrodes and the plurality of first portions of the drain electrode are ohmic contact electrodes, the second portion of the drain electrode is an interconnection metal of the plurality of first portions of the drain electrode, and the ohmic contact electrodes have the same size.

15. The method of claim 14, wherein the gaps between adjacent ohmic contact electrodes are the same.

16. The method of claim 14, wherein the plurality of source electrode pads have a symmetric arrangement with respect to a central line of the active region.

* * * * *